United States Patent
Burchardt (10) Patent No.: US 12,210,068 B2
(45) Date of Patent: Jan. 28, 2025

(54) METHOD AND DEVICE FOR PREDICTING STATE OF HEALTH AND REMAINING LIFETIME FOR USED ELECTRIC VEHICLE BATTERIES

(71) Applicant: ECO STOR AS, Oslo (NO)

(72) Inventor: Trygve Burchardt, Howell, MI (US)

(73) Assignee: ECO STOR AS, Oslo (NO)

( * ) Notice: Subject to any disclaimer, the term of this patent is extended or adjusted under 35 U.S.C. 154(b) by 372 days.

(21) Appl. No.: 17/581,311

(22) Filed: Jan. 21, 2022

(65) Prior Publication Data
US 2022/0146589 A1 May 12, 2022

Related U.S. Application Data (63) Continuation of application No. PCT/IB2020/056973, filed on Jul. 23, 2020.

(60) Provisional application No. 62/877,868, filed on Jul. 24, 2019.

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/3835* (2019.01);
(Continued)

(58) Field of Classification Search
CPC ............. G01R 31/392; G01R 31/367; G01R 31/3835; G01R 31/389; H01M 10/425;
(Continued)

(56) References Cited

U.S. PATENT DOCUMENTS

2010/0312744 A1 12/2010 Prokhorov et al.
2015/0197164 A1* 7/2015 Lee .................. B60L 58/21
701/22

(Continued)

OTHER PUBLICATIONS

Du Jingcai et al: "Battery remaining useful life prediction under coupling stress based on support vector regression", Energy Procedia, Elsevier, NL, vol. 152, Nov. 5, 2018 (Nov. 5, 2018), pp. 538-543.

(Continued)

*Primary Examiner* — Tung S Lau
(74) *Attorney, Agent, or Firm* — Foley & Lardner LLP (57) ABSTRACT

Understanding a health status and expected remaining lifetime of an EV (electric vehicle) battery is important before repurposing the battery for second life applications. A device for connecting to an unopened EV battery pack via operable coupling to signal and power wiring is disclosed. The device enables access to diagnostic information from the unopened EV battery. The device measures cell and/or module voltages and currents within the battery pack for several different depths of discharge. A self-learning algorithm implemented by the diagnostic device, which uses historical data and diagnostic information from the battery pack, determines a condition of the battery and provide recommended operational conditions for future use of the battery. For example, a degradation slope and expected capacity loss over time can be determined based on measured variations of cell and/or modular voltages and subsequently used, with cell impedance data, to recommend an operational C-rate for the battery pack.

20 Claims, 6 Drawing Sheets

(51) Int. Cl.

| | |
|---|---|
| *G01R 31/3835* | (2019.01) |
| *G01R 31/389* | (2019.01) |
| *H01M 10/42* | (2006.01) |
| *H01M 10/44* | (2006.01) |
| *H01M 10/48* | (2006.01) |
| *H02J 7/00* | (2006.01) |

(52) U.S. Cl.
CPC ........ *G01R 31/389* (2019.01); *H01M 10/425* (2013.01); *H01M 10/44* (2013.01); *H01M 10/48* (2013.01); *H02J 7/0048* (2020.01); *H02J 7/005* (2020.01); *H01M 2010/4271* (2013.01); *H01M 2220/20* (2013.01)

(58) Field of Classification Search
CPC ................. H01M 10/44; H01M 10/48; H01M 2010/4271; H01M 2220/20; H02J 7/0048; H02J 7/005; Y02E 60/10
See application file for complete search history.

(56) References Cited

U.S. PATENT DOCUMENTS

| | | |
|---|---|---|
| 2016/0001670 A1 | 1/2016 | Lee |
| 2016/0011274 A1 | 1/2016 | Morita et al. |
| 2016/0089994 A1 | 3/2016 | Keller et al. |
| 2016/0109526 A1* | 4/2016 | Geffin ................ G01R 31/3648 702/189 |
| 2017/0219660 A1 | 8/2017 | Christensen et al. |
| 2020/0284846 A1* | 9/2020 | Pajovic ................ G01R 31/396 |

OTHER PUBLICATIONS

International Search Report and Written Opinion on PCT/IB2020/056973 dated Nov. 5, 2020 (11 pages).

Pang Bo et al: "Research on Modeling Method of Life Prediction for Satellite Lithium Battery Based on SVR". 2018 Prognostics and System Health Management Conference (PHM-Chongqing), IEEE, Oct. 26, 2018 (Oct. 26, 2018), pp. 1004-1009.

Perra A et al: "Tracking Internal Resistance Extends Life of Ups Batteries" Control Solutions, Pennwell Publishing, Tulsa, OK, US, vol. 67, No. 5, May 1, 1994 (May 1, 1994), pp. 77-79.

Ceraolo Massimo et al: "Experimental Analysis of NMC Lithium Cells Aging for Second Life Applications", 2018 IEEE International Conference On Environment and Electrical Engineering And 2018 IEEE Industrial and Commercial Power Systems Europe (EEEIC / I&CPS Europe), IEEE, Jun. 12, 2018 (Jun. 12, 2018), pp. 1-6.

Extended European Search Report in EP24185040 dated Sep. 30, 2024 (6 pages).

* cited by examiner

METHOD AND DEVICE FOR PREDICTING STATE OF HEALTH AND REMAINING LIFETIME FOR USED ELECTRIC VEHICLE BATTERIES

CROSS-REFERENCE TO RELATED PATENT APPLICATIONS

The present application is a continuation of PCT Application No. PCT/IB2020/056973 filed Jul. 23, 2020, which claims the benefit of and priority to U.S. Patent Application No. 62/877,868 filed Jul. 24, 2019, the entire disclosures of which are incorporated by reference herein.

BACKGROUND

The present disclosure relates to a diagnostic device for determining a state of health for a used electric vehicle battery. Furthermore, the disclosure relates to a device and method for determining remaining lifetime and performance of a used electric vehicle battery without opening the case that seals the battery pack and battery monitoring system.

A used electric vehicle (EV) battery often contains a large number of single battery cells or battery modules packaged into a hermetically sealed steel frame, and connected together in parallel and/or in series to give a required output voltage and current. In addition, the EV battery may include a battery management system that monitors the performance of the batteries and secures safe operations. To comply with automotive safety quality standards a number of sensors are frequently included within the battery pack. Historical data such as temperature during charge and discharge, state of charge and state of discharge, cycle number, cell voltages etc. are all gathered during the automotive life of the battery and stored within a BMS (Battery Monitoring System).

Generally, reuse of EV batteries involves disassembly the batteries, by opening the pack and removing the cells or modules. Removed cells or modules can then be sorted based on various parameters (e.g., voltages, capacities, and/or impedances), wherein the cells and modules having the most desirable parameters (e.g., based on predetermined benchmarks) are selected for reuse. It is commonly held that, following use of an EV battery within an automotive application, a variation in cell impedance and cell voltage is large within the battery pack; however, this is frequently not the case.

Generally, sourcing batteries for automotive applications places stringent requirements on battery manufacturers and, typically, only tier 1 products are accepted (e.g., cells within the batteries are balanced and/or only cells falling within specified ranges). Furthermore, a BMS developed for automotive use is more advanced (e.g., includes more safety features, generally operates within higher voltage and power ranges) in comparison with low-cost consumer electronics and power tools. Accordingly, battery performance in automotive application is, in comparison to use in other electronics and contrary to popular opinion, correspondingly increased. Thus, it would be advantageous to provide a method for reusing a complete battery system, which focuses on reconfiguring software and electrical signal processing, as an alternative to mechanically disassembling the battery pack, sorting cells and modules and rebuilding them into a new system.

No known current methods for repurposing an EV battery for energy storage applications do not require opening the battery pack. Furthermore, there are no known current methods for obtaining diagnostic information from an unopened used EV battery pack and using said diagnostic information to predict remaining performance and lifetime of the battery. Such diagnostic information may include state of health, state of charge, a number of lifetime cycles, capacity, impedance, and/or impedance.

Japanese Patent Publication No. JP 2007-141464 discloses a method that includes obtaining, from a secondary battery system, at least one or more pieces of battery information (i.e., selected from a resistance, a capacity, a battery use time, a resistance change rate, a capacity change rate, and a battery use intensity), determining if an obtained piece of battery information has reached a preset threshold value, reclaiming the secondary battery module upon determination that the threshold value has been reached; grading the reclaimed secondary battery module based on its corresponding battery; and, applying the reclaimed secondary battery module to a system having threshold value conditions under which it can operate at the performance of the battery that the secondary battery module has at the time when it is being reclaimed. Thus, although diagnostic information needed to understand the state of health for an EV Li-ion battery has been disclosed previously, none disclose methods or systems that enable discernment of diagnostic information at the module or cell level to facilitate reuse of the battery in a second life battery system. Such battery/battery pack level state of health determinations frequently only represent average diagnostic information for the battery/battery pack and, consequently, fail to assess if one or more cells and/or modules are at risk of failure.

Accordingly, it would be advantageous to provide device and method to communicate with battery cells and modules within a closed EV battery without needing to open the case enclosing the battery and electronics. Furthermore, it would be advantageous to provide a device and method to gather state of health information for a used EV battery and predict a remaining life of the battery at a cell and/or modular level.

SUMMARY

The foregoing summary is illustrative only and is not intended to be in any way limiting. In addition to the illustrative aspects, embodiments, and features described above, further aspects, embodiments, and features will become apparent by reference to the following drawings and the detailed description.

According to an exemplary embodiment, a method for predicting remaining lifetime of used and unopened electric vehicle battery comprises: determining, by a diagnostic device, performance data associated with a battery, wherein the battery is operably coupled to the diagnostic device, and wherein the performance data comprises one or more performance parameters; determining, by the diagnostic device, a state of health of the battery, wherein the state of health is based on the performance data; comparing, by the diagnostic device, the determined performance data to stored data, wherein the stored data is associated with one or more deployed second use batteries; and predicting, by the diagnostic device, a remaining expected life of the battery based on the comparison of the determined performance data to the stored data.

According to an exemplary embodiment, the method further comprises: determining, by the diagnostic device, a set of preferred operation parameters for the battery, wherein the determination is based on at least one of the state of health of the battery and the predicted remaining expected life of the battery; providing, by the diagnostic device, a recommendation related to a second life use application for the battery based on the determined preferred operation parameters.

According to an exemplary embodiment, the diagnostic device may be operably coupled to the battery via a control unit associated with the battery.

According to an exemplary embodiment, the battery comprises one or more electrochemical cells.

According to an exemplary embodiment, determining the state of health of the battery comprises: reading a voltage associated with battery; determining a state of charge of the battery; discharging the battery to a first predetermined capacity set point; charging the battery to a second predetermined capacity set point; performing a current interrupt operation to determine an impedance associated with the battery; wherein at least one of the first predetermined capacity set point and the second capacity set point are based on the state of charge of the battery.

According to an exemplary embodiment, the impedance is based on a Randles circuit equivalent model.

According to an exemplary embodiment, the performance data includes at least one of an internal resistance, a voltage, an efficiency, a maximum discharge capacity, and a maximum charge capacity.

According to an exemplary embodiment, a method for predicting a remaining lifetime of a used and unopened electric vehicle battery comprises performing, by a diagnostic device coupled to battery, a calibration operation. The calibration operation comprises: varying a current interruption interval provided to the battery during a predetermined interruption time period; measuring an internal resistance associated with the battery during the interruption time period; and setting the current interruption interval based on a determined minimum internal resistance corresponding to the current interruption interval. The method also comprises: determining, by the diagnostic device, a state of health of the battery, wherein the state of health is based on the minimum internal resistance; comparing, by the diagnostic device, the determined minimum internal resistance to stored data, wherein the stored data corresponds to one or more deployed second life batteries; and predicting, by the diagnostic device, a remaining expected life of the battery based on the comparison of the determined minimum internal resistance to the stored data.

According to an exemplary embodiment, the method further comprises repeating, by the diagnostic device, the calibration operation when the battery is discharged to a predetermined state of discharge.

According to an exemplary embodiment, determining the state of health of the battery comprises: reading a voltage associated with battery; determining a state of charge of the battery; discharging the battery to a first predetermined capacity set point; charging the battery to a second predetermined capacity set point; and performing a current interrupt operation to determine an impedance associated with the battery; wherein at least one of the first predetermined capacity set point and the second capacity set point are based on the state of charge of the battery.

According to an exemplary embodiment, the current interrupt operation is based on the set current interruption interval.

According to an exemplary embodiment, the internal impedance is based on a Randles circuit equivalent model.

According to an exemplary embodiment, a device for predicting a remaining lifetime of a used and unopened electric vehicle battery comprises a non-transitory computer-readable medium storing a computer program therein, which, when executed, causes the controller to perform operations comprising: determining performance data associated with a battery, wherein the performance data comprises one or more performance parameters; determining a state of health of the battery based on the performance data; comparing the performance data to stored data, wherein the stored data is associated with one or more deployed second use batteries; and predicting a remaining expected life of the battery based on the comparison of the determined performance data to the stored data.

According to an exemplary embodiment, the operations further comprise: determining a set of preferred operation parameters for the battery, wherein the determination is based on at least one of the state of health of the battery and the predicted remaining expected life of the battery; and providing a recommendation related to a second life use application for the battery based on the determined preferred operation parameters.

According to an exemplary embodiment, the diagnostic device is operably coupled to the battery via a control unit associated with the battery.

According to an exemplary embodiment, determining the state of health of the battery comprises: reading a voltage associated with battery; determining a state of charge of the battery; discharging the battery to a first predetermined capacity set point; charging the battery to a second predetermined capacity set point; and implementing a current interrupt method to determine an impedance associated with the battery; wherein at least one of the first predetermined capacity set point and the second capacity set point are based on the state of charge of the battery.

According to an exemplary embodiment, the operations further comprise: varying a current interruption interval provided to the battery during a predetermined interruption time period; measuring an internal resistance associated with the battery during the interruption time period; and setting the current interruption interval based on a determined minimum internal resistance corresponding to the current interruption interval.

According to an exemplary embodiment, the controller is operably coupled to a power converter, and wherein the controller is configured to cause the power converter to charge or discharge the battery based on a voltage associated with the battery.

According to an exemplary embodiment, the controller causes the power converter to discharge the battery if the voltage meets a predetermined voltage threshold.

According to an exemplary embodiment, the operations further comprise: determining historical information associated with the battery, wherein the historical information comprises one or more operational parameters corresponding to a first use application o the battery.

BRIEF DESCRIPTION OF THE DRAWINGS

The foregoing summary is illustrative only and is not intended to be in any way limiting. In addition to the illustrative aspects, embodiments, and features described above, further aspects, embodiments, and features will become apparent by reference to the following drawings and the detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

The present disclosure describes a method and a diagnostic device that may be operably coupled to signal and power wires of an EV battery to enable communication with an internal battery monitoring system (BMS). The diagnostic device may include software to enables the diagnostic device to communicate with the BMS. Through the BMS, the diagnostic device may gain historical use information related to the EV battery. The diagnostic device may, via the BMS, determine cell/module voltages associated with the EV battery and obtain corresponding polarization curves for different states of charge/discharge.

In addition, the diagnostic device may be operably coupled to a power source to provide a set voltage to the battery and enable measurement a resulting rate of voltage recovery and current flow. By measuring a slope of recovery at different voltages, a corresponding cell impedance can be determined. For example, a single EV battery cell may be tested at 4V, 3.5V, 3.2V, and 3V to determine the slope of recovery. This method of determining the impedance based on measuring slope recovery is called "the current interrupt method." Alternatively, AC impedance spectroscopy can be used; however, it is time consuming and very difficult to perform on a multi-cell battery stack.

Furthermore, the present disclosure includes a method for collecting data from deployed second life batteries via the diagnostic device to enable generation and calibration of health status and/or remaining life predictions derived from real use case data. In various embodiments, the collected data may include, but is not limited to, voltage, current, impedance, and/or operational temperature (e.g., during charge and/or discharge). In various embodiments, the data may be collected during a charge and/or discharge cycle. In some embodiments, the method may implement data collection with a constant or varied data resolution. For example, data may be collected based on a time interval (e.g., every 5 seconds, every minute) and/or a cycle interval (e.g., every 5 cycles, every 10 cycles). The method may further implement a self-learning algorithm may use the historical data from deployed second life battery systems to continuously improve predictions of remaining lifetime and/or health status of second life EV batteries.

Though there are some existing methods and assumed best practices for building battery systems, few address the requirements and conditions (e.g., second life battery degradation rates, degradation mechanisms, and/or corresponding preventative measures, etc.) needed to rebuild used battery systems to enable second life in a new application. Moreover, no existing methods describe how to reuse a complete battery system for second life use without opening the battery case. Furthermore, no existing diagnostic tools nor related methods can determine a state of health for used EV batteries (i.e., second life batteries) without opening the battery.

Generally, to reuse a complete battery having a cell or modular organizational structure, knowledge of historical use of the battery (e.g., use during a first life) and related diagnostic data is required—preferably without opening the battery pack. For example, if an EV battery was operated for extended periods at extreme temperatures (e.g., high or low) in one or more first life applications, the EV battery may show or may begin to show signs of degradation (or may have an accelerated rate of degradation) during use in a second life application. Accordingly, using the disclosed method, historical use of the battery (e.g., prior operational temperatures) may inform selected use applications and/or operational parameters (e.g., operation at moderate temperatures, moderate or slow charge/discharge rates, lower depth of discharge, lower power, etc.) to prevent further degradation and/or slow a rate of degradation of the EV battery. Without such knowledge, it is challenging to predict the remaining life of the battery. In various implementations, end of life for a battery may be defined by a point in time and/or operation cycle when a battery capacity falls below a threshold amount (e.g., percentage) of an initial capacity. In various implementations the threshold amount may be lower for a second life battery (e.g., 40-60%) compared to a first life battery (e.g., 70%) and subsequently determine optimal use parameters (e.g., depth of discharge, power capacity, etc.) to ensure best possible operation of the EV battery during its remaining lifetime. In various embodiments, the diagnostic device may determine a recommended one or more operational parameters for a battery and/or a recommended use application for the battery/battery pack based on a state of health determination and/or prediction of remaining lifetime for the battery/battery pack. In various embodiments, the diagnostic device may determine a recommended one or more operational parameters for a battery and/or a recommended use application for the battery/battery pack based on a state of health determination and/or prediction of remaining lifetime for one or more cells/modules within the battery/battery pack. For example, if historical information is obtained related to cell or modular voltages for a battery pack at multiple different stages of discharge, analysis of voltage variations among the cells and/or modules within the battery pack may be possible and subsequently used to estimate remaining lifetime of the battery pack. Furthermore, if impedance data is available for the battery pack (and comprising cells and/or modules), it may be possible to predict which, if any, cells and/or modules may be at risk of failure and/or risk of subsequent loss in capacity. In various implementations, failure may be defined by a point in time and/or operation cycle when a battery becomes unable charge or discharge a threshold amount (e.g., in relation to an initial capacity). In various embodiments, failure may be predicted based on a cell/module and/or battery/battery pack impedance. In various embodiments, failure may be predicted or determined based on a trend in cell/module and/or battery/battery pack impedance (e.g., over time, over a number of cycles). Additionally, inputs related to historical data such as cycle life, discharge and charge rates, temperature, etc. may also be relevant in determining a degradation curve of the battery. In various embodiments, the degradation curve may show a charge and/or discharge capacity of the battery as a function of time and/or cycle number.

Generally, all communication (e.g., communications relating to determination of voltage, current, impedance, and/or temperature) with cells and/or modules in an unopened battery pack is routed through its corresponding BMS and, consequently, a separate device is often required to access data from the unopened battery pack via the BMS. Furthermore, it is often insufficient to solely read the cell and/or module voltages from the BMS to determine the state of health. In addition, a diagnostic device should also be able to set a given voltage potential and exchange current outputs and inputs with the battery cells and/or modules. In various embodiments, the BMS may set a voltage for a battery/ battery pack and measure a corresponding voltage during discharge for one or more cells/modules within the battery/ battery pack. The BMS may then adjust a current supplied to the cell based on the determined cell/module voltage. For example, if the BMS determines that the voltage is dropping for one or more cells/modules when the voltage for the battery/battery is set, the BMS may reduce current to the one or more cells/modules. Preferably, the diagnostic device also access and report on historical life information (e.g., first life use) of the EV battery (i.e., when the battery was originally used in an EV).

For battery packs wired in series and/or in parallel and stored in a closed container, methods such as EIS (electrochemical impedance spectroscopy) are not well suited for determining parameters (e.g., impedance) pertinent to determination of health status and/or historical information as EIS is often expensive and obtaining reliable data can be time consuming. Furthermore, if the battery is not well shielded (e.g., to inhibit high frequencies), electromagnetic noise often makes the EIS results hard to interpret.

As previously described, a method and diagnostic device for collecting information related to a state of health of a used EV battery without requiring battery opening is disclosed. In various embodiments, the diagnostic device may be operably coupled to signal and power cables leading to the battery, which may enable communication with the internal BMS of the EV battery and facilitate sending/ receiving communication signals and energy to/from the EV battery. In various embodiments, the communication signals may include, but are not limited to, requests to/from the BMS to read voltage and/or current, requests for the BMS to deliver or the battery to accept a load until a threshold voltage is reached, etc.

In various embodiments, the diagnostic device may deliver and receive DC energy from the coupled battery pack. In various embodiments, this may be accomplished via a power converter in the form of a battery within, or in operable communication with, the diagnostic device that can be used to charge and discharge the used EV battery. The power converter may enable the diagnostic device to (e.g., through a connection to a power source), at a minimum, perform 3 voltage measurements at different states of discharge. In various embodiments, the diagnostic device may perform voltage measurements at 100%, 50%, and 10% states of discharge.

Figure 1:
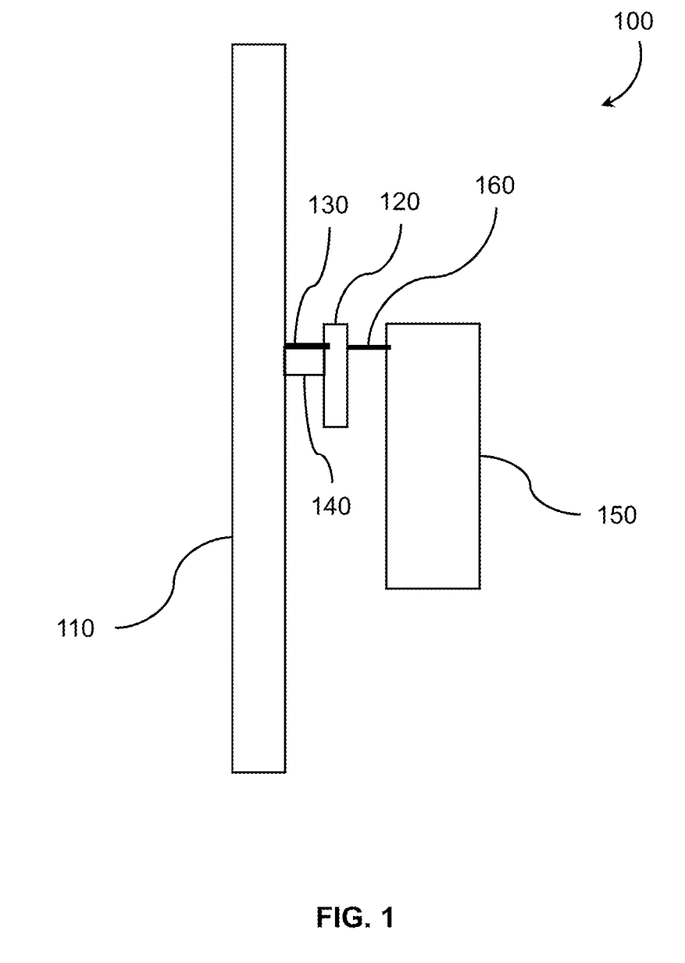
FIG. 1 shows a schematic representation of a diagnostic device in connection with an EV battery system, according to an exemplary embodiment.

FIG. 1 shows a schematic representation of a second life battery system 100 having a battery 110 operably coupled to a diagnostic device 120, according to an exemplary embodiment. Battery 110 may be a second life battery/battery pack that is unopened after removal from a first life use or application. As shown in FIG. 1, the unopened battery 110, which may include a BMS, is operably coupled to the diagnostic device 120 (e.g., via the BMS of the battery 110). In various embodiments, the battery 110 may be a Li-ion battery configured for use in an EV. In various embodiments, the battery 110 may be configured to provide energy/power to one or more energy systems including, but not limited to, fast charge stations, buildings, EVs, backup storage systems, etc. As shown, the battery 110 is operably coupled to the diagnostic device 120 via a power cable 130 and a signal cable 140. In various embodiments, signal cable 140 may be configured to enable exchange of one or more signals between the battery 110 and the coupled diagnostic device 120. In various embodiments, the signals may include, but are not limited to, indications relating to a state of the battery, commands to change a state of the battery, commands to change a voltage or current associated with the battery, and/or commands to determine operational parameters such as voltage, current, impedance, and/or temperature. In various embodiments, the one or more signals may include, but are not limited to, historical information relating to an impedance, capacity, state of charge (SoC), state of discharge (SoD), one or more performance metrics (e.g., charge/discharge efficiency), a temperature, a voltage measurement, a current measurement, a status associated with the battery 110, etc. In various embodiments, the diagnostic device 120 may include, but is not limited to, one or more controllers, one or more processors and/or microprocessors (e.g., CPU), a memory, etc. In various embodiments, the control unit 120 hardware may also include a housing to contain the one or more controllers, processors, and/or memory. In various embodiments, the diagnostic device 120 may implement one or more algorithms (e.g., to read a received signal and determine an appropriate response) to facilitate signal exchange with the battery 110. In various embodiments, power cable 130 may be configured to enable exchange of power (e.g., send and/or receive) between the battery 110 and the coupled diagnostic device 120. In various embodiments, the diagnostic device 120 may first read a voltage of one or more cells/modules within the battery 110. The diagnostic device 120 may then determine, based on the voltage level, whether to provide power to or draw power from the battery. As shown in FIG. 1, the diagnostic device 120 is operably coupled, via a power cable 160, to a power converter 150. In various embodiments, the power converter 150 may be connected to a grid, or preferably the power converter 150 may be a portable power converter in the form of a battery. In various embodiments, the power converter 150 may receive a load from the EV battery 110 so as to discharge the battery 110 or, alternatively, the power converter 150 may deliver a load to the battery 110 in order to charge it. In various embodiments, the power converter 150 may include one or more secondary Li-ion EV batteries and/or a DC converter. In various embodiments, the diagnostic device 120 may include or be in communication with a user interface (e.g., graphical user interface). In various embodiments, the user interface may start up when the diagnostic device 120 is connected or coupled to a battery 110. In various embodiments, the user interface may include one or more selection regions (e.g., button, touch sensitive area or button, knobs, levers, etc.) that, when engaged, may cause the diagnostic device 120 to conduct a diagnostic operation related to the battery 110. In various embodiments, the user interface may display and/or output performance data associated with the battery 110 (e.g., impedance) at different points (e.g., time, cycles, levels of discharge, etc.) and generate a polarization curve. The data within the polarization curve may be compared (by the diagnostic device 120) to a database of historical data and theoretical predictions on lifetime (e.g., corresponding to tested second life batteries) accessible by or maintained on the diagnostic device 120. The diagnostic device may then provide a predicted lifetime of the battery 110, which may include a number of cycles at different capacities and/or power levels. The prediction may then be used (e.g., by the diagnostic device 120) to select and/or recommend a best use (i.e., including recommended operational parameters) for the second life battery.

Figure 2:
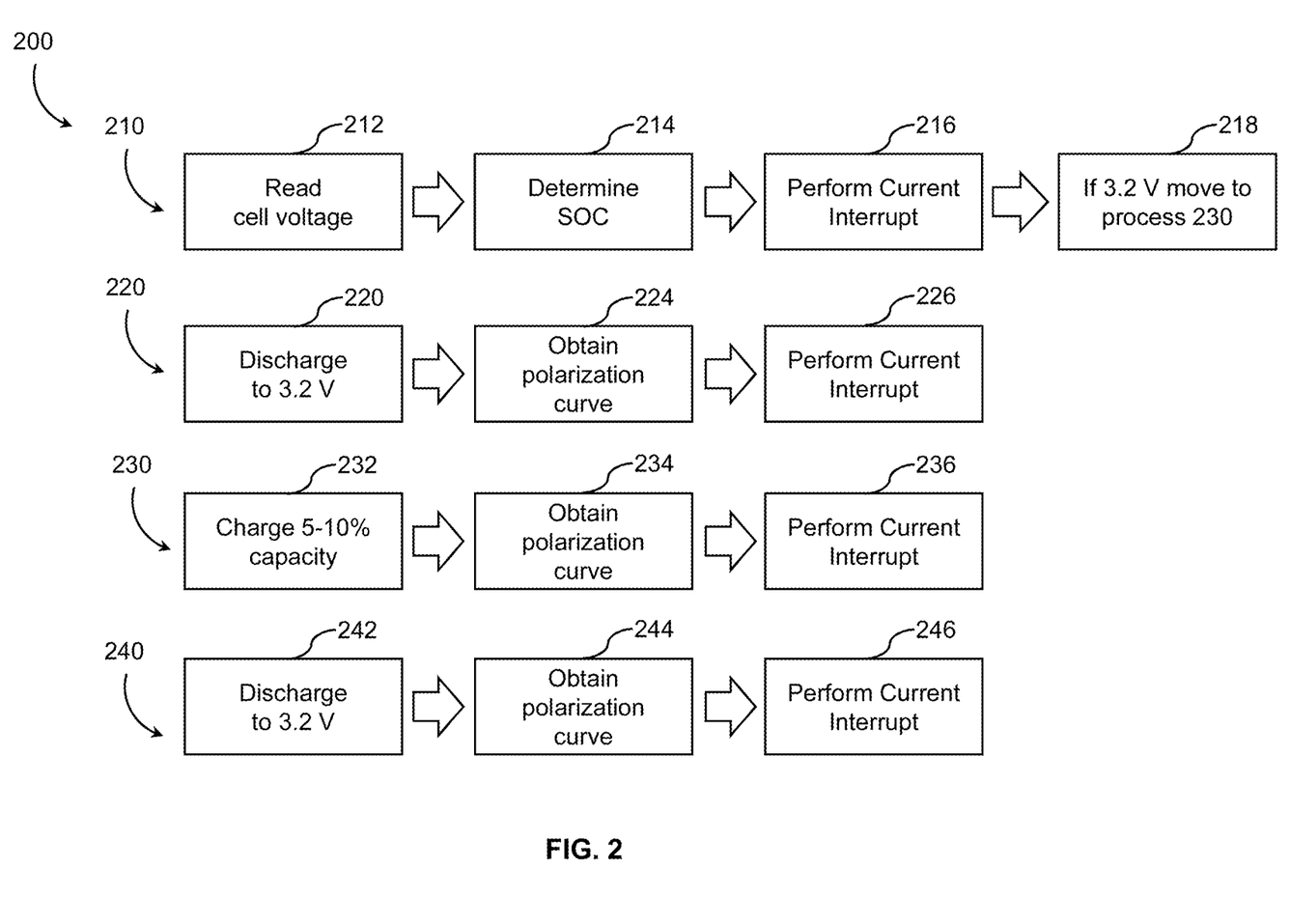
FIG. 2 shows a schematic block diagram of method for gathering diagnostic information to determine a state of health of an EV battery, according to an exemplary embodiment.

FIG. 2 shows a block diagram illustrating a method 200 implemented by the diagnostic device 120 after is connected to the EV battery 110, according to an exemplary embodiment. As shown, method 200 includes four series of operations 210, 220, 230, and 240. In the first series 210, the diagnostic device 120 may read cell and/or module voltages (e.g., via signal cable 140), during operation 212, for all cell/modules included within the battery pack 110. For example, a single cell Li-ion EV battery may have a cut-off voltage of approximately 3.2 V (or, for a module of 2 cells, such as for a Nissan® Leaf battery, the cut of voltage is approximately 4.4V). After reading the voltage in operation 212, the diagnostic device 120 may determine (e.g., by one or more processors within the diagnostic device 120) and provide (e.g., via an output on a GUI) an indication of how much remaining capacity is present in the pack by determining a state of charge (SoC) in operation 214. In an exemplary embodiment, for cells having a determined voltage lower than 3.2V, or if no voltage can be read from a particular cell or module within the battery 110, it may be assumed (e.g., by one or more controllers within the diagnostic device 120) that the particular cell/module have been disconnected from the battery pack 110, and the capacity corresponding to the particular cell/module is lost for second life use within the battery back 110. In various implementations, most EV batteries 110 may have low (e.g., below a threshold voltage associated with a particular application or use or related to a rated charge capacity) to no remaining capacity when attached to the diagnostic tool. In some cases, the low to no remaining capacities of the EV battery 100 may be attributed to discharging (e.g., by a user or based on a particular use case) prior to removal from the EV. In other cases, second life EV batteries may be stored for prolonged time periods after the end of a first life use.

In various embodiments, the diagnostic device 120 may implement the "current interrupt method" (operation 216) on all single cell batteries 110 that have a determined voltage of 3.2 V (operation 218) to determine an impedance of the battery 110. Should the diagnostic device 120 determine that the cells/modules within battery 110 does not have a voltage of approximately 3.2V, the diagnostic device 120 may proceed (e.g., as determined by one or more controllers therein) to series 230.

In series 220, remaining capacity (if any) of the battery 110 may be discharged (e.g., via the power converter 150) by the diagnostic device 120 in operation 220 so that all cells/modules within battery 110 may have a voltage of approximately 3.2V (i.e., on a cell level). In various embodiments, the power converter 150 may itself contain a battery that might discharge the battery 110 (e.g., by charging the power converter 150). In various embodiments, if the power converter 150 is connected to a grid it might discharge the battery 110 by unloading to the grid. In various embodiments, if the power converter 150 contains a load bank (e.g., resistors), the power converter 150 may discharge the EV battery 110 by heating the load bank (e.g., resistors). In various embodiments, discharging of battery 110 can be accomplished by applying a constant load to the EV battery 110 (i.e., on a cell level, reducing the voltage slowly, such as at approximately a rate of 1 mV/sec) and monitoring voltage and current of each cells/module within the battery 110. In various embodiments, discharge curves may be obtained (e.g., via a processor and/or controller) in an operation 224 to subsequently provide (e.g., via a GUI) information related to a balance of plant for the EV battery 110. After the discharge curves (i.e., polarization curves) have been obtained in operation 224, the diagnostic device 120 may again implement the "current interrupt method" in operation 226 to determine the impedance of the cells/modules within battery 110.

In series 230, for EV batteries 100 containing cells/modules that initially have little or no remaining capacity (i.e., as determined in operation 214), the diagnostic device 120 may charge the cells/modules of battery 110 (e.g., via the power converter 150) to 5-10% of total capacity in an operation 232. For example, in a Nissan® Leaf battery having a rated remaining total capacity of 15 KWh, 5-10% of capacity corresponds to charging the battery to 1-2 KWh. In various embodiments, the charging is carried out with constant current and voltage on the cells/modules of battery 110 may be recorded (e.g., via a memory within the diagnostic controller). After charging the cells/modules within battery 110 to approximately 5-10% of total capacity, the diagnostic device 120 may again obtain charge/discharge curves (e.g., polarization curves) in an operation 234 and proceed to operation 236. In operation 236, the diagnostic device 120 may again implement the "current interrupt method" to determine impedance of all cells/modules within the battery 110 at end of the operation 232 (i.e., once charging is complete).

In series 240, the battery 110 is discharged (e.g., via the power converter 150) by the diagnostic device 120 in operation 242 until all cells/modules within the battery 110 may show a voltage of approximately 3.2V (i.e., on a cell level). In various embodiments, discharging may be accomplished by applying a constant load to the EV battery 110 (i.e., on a cell level, reducing the voltage at a rate of approximately 1 mV/sec) and monitoring the corresponding voltages and current of the cells/modules within the battery 110. In operation 244, the diagnostic device 120 may again obtain discharge curves (e.g., polarization curves) to determine and/or provide (e.g., via a GUI) information on the balance of plant for the EV battery 110. Upon completing of operation 244, the diagnostic device 120 may again implement the "current interrupt method" in operation 246 to determine the impedance of all cells/modules within the battery 110. Although FIG. 2 illustrates method 200 including operations 218, 220, and 242 relating to voltage thresholds of 3.2V, in various implementations, method 200 may be carried out wherein said operations may be based on any one or more voltage thresholds, and wherein the voltage thresholds may be determined by a user, the diagnostic device 120, and/or based on an operating requirement of the battery 110. Although FIG. 2 illustrates method 200 including operation 232 as relating to 5-10% charge capacity, in various implementations, method 200 may be carried out wherein operation 232 may be carried out based on any one or more preset charge capacities, and wherein the preset charge capacity may be determined by a user, the diagnostic device 120, and/or based on an operating requirement of the battery 110.

As illustrated in FIG. 2, through implementation of method 200, the diagnostic device 120 may enable determination of sufficient diagnostic information about a battery 110 to subsequently determine the state of health for the used EV battery 110. As previously described the state of health may be determined by determining a voltage balancing of cells/modules in a battery/battery pack, a capacity of the battery/battery pack, and/or an impedance of the cells/modules within the battery/battery pack. In various implementations, state of health may be determined or characterized as a percentage ranging from 0% to 100%, which may correspond to a battery that is not operational and a new battery, respectively. In various implementations, a battery may be determined to have a good or bad state of health if the determined state of health percentage is above or below one or more predetermined thresholds, respectively.

In various embodiments, the diagnostic device 120 may store thereon (e.g., via a memory and/or processor) a software program to facilitate recordation and storage of information gathered during use of the diagnostic device 120. In an exemplary embodiment, every time a battery (e.g., battery 110) is coupled to the diagnostic device 120 for various measurements, the diagnostic device 120 may record and store a date corresponding to when the battery was assessed. In various embodiments, the collected data (e.g., impedance, initial capacity, temperature, voltage, current, capacity, cycle number, discharge depth, charge/discharge rate, accumulated capacity, etc. for a time point or cycle and/or over a period of time or number of cycles) may be used by the diagnostic device 120 (e.g., via a controller contained therein) to compare the measured diagnostics (i.e., data collected during implementation of method 200) against actual performance data (e.g., performance data from another cell that is not being diagnosed) corresponding to a second life use application. Often, when batteries (such as battery 110) are prepared for a second life use, the batteries may be supplied with a memory (e.g., chip within a battery BMS) and/or microprocessor to record performance (e.g., charge capacity, discharge capacity, efficiency, etc.) of the battery during use. This recorded data may be collected by the diagnostic device 120 and continuously updated within the hardware (e.g., via a controller, memory, and/or processor) of the diagnostic device 120. Accordingly, a self-learning algorithm may be used to predict performance data for a battery in a second life use based on the diagnostic data collected during implementation of method 200. In various implementations, the diagnostic device 120 may, via the self-learning algorithm, continuously improve accuracy of predictions of performance for batteries within a second life use.

In various embodiments, if the diagnostic device 120 gains access to historical data of battery 110 corresponding to its first use—such as first use within an EV—via communication with the battery 110 BMS. The data received by the diagnostic device 120 may subsequently be used within the self-learning algorithm. In various embodiments, the collection of historical data by the diagnostic device 120 may enable sorting of batteries intended for second life use applications based on historical use of said batteries, simple diagnostic measurements (i.e., measurements conducted through implementation of method 200), and data from previously deployed second life batteries.

In various embodiments, a control unit coupled to a second life battery may implement (e.g., via software contained therein) the information obtained by the diagnostic device 120. In various embodiments, the diagnostic device 120 may be configured to continuously share (e.g., copy) improving diagnostic data with the control unit of a second life battery, and consequently facilitate establishment of a second life battery system that operates under continuously evolving operating conditions.

In various embodiments and as previously described, the electrochemical "current interrupt method" may be used to determine impedance of modules/cells within a battery/battery pack (e.g., battery 110). In various implementations, the "current interrupt method" may be carried out by changing a load current from the battery operating current or the polarizing current to an open circuit potential and simultaneously measure a resulting change in cell/module voltage. Using the "current interrupt method," a battery's internal resistance may be determined to be equal to the change in voltage (caused by changing the load current) and divided by the change in load current. In comparison to a more commonly used method such as electrochemical impedance spectroscopy (EIS), the "current interrupt method" allows for the battery internal resistance ($R_{int}$) to be measured at large polarization currents (e.g., approximately greater than or equal to 80% of maximum rated levels) using a, typically, cost-effective source measure unit (SMU), which is an instrument configured to source and measure both voltage and current simultaneously. Such a measurement is sufficiently difficult that often more expensive EIS instruments cannot accomplish such measurements at high current levels (e.g., approximately greater than or equal to 80% of maximum rated levels). In fact, historically, electrochemists have used an oscilloscope and a switch (for the load) to perform these measurements simultaneously and have achieved what has been termed a figure of merit rather than a real internal resistance $R_{int}$.

Figure 3:
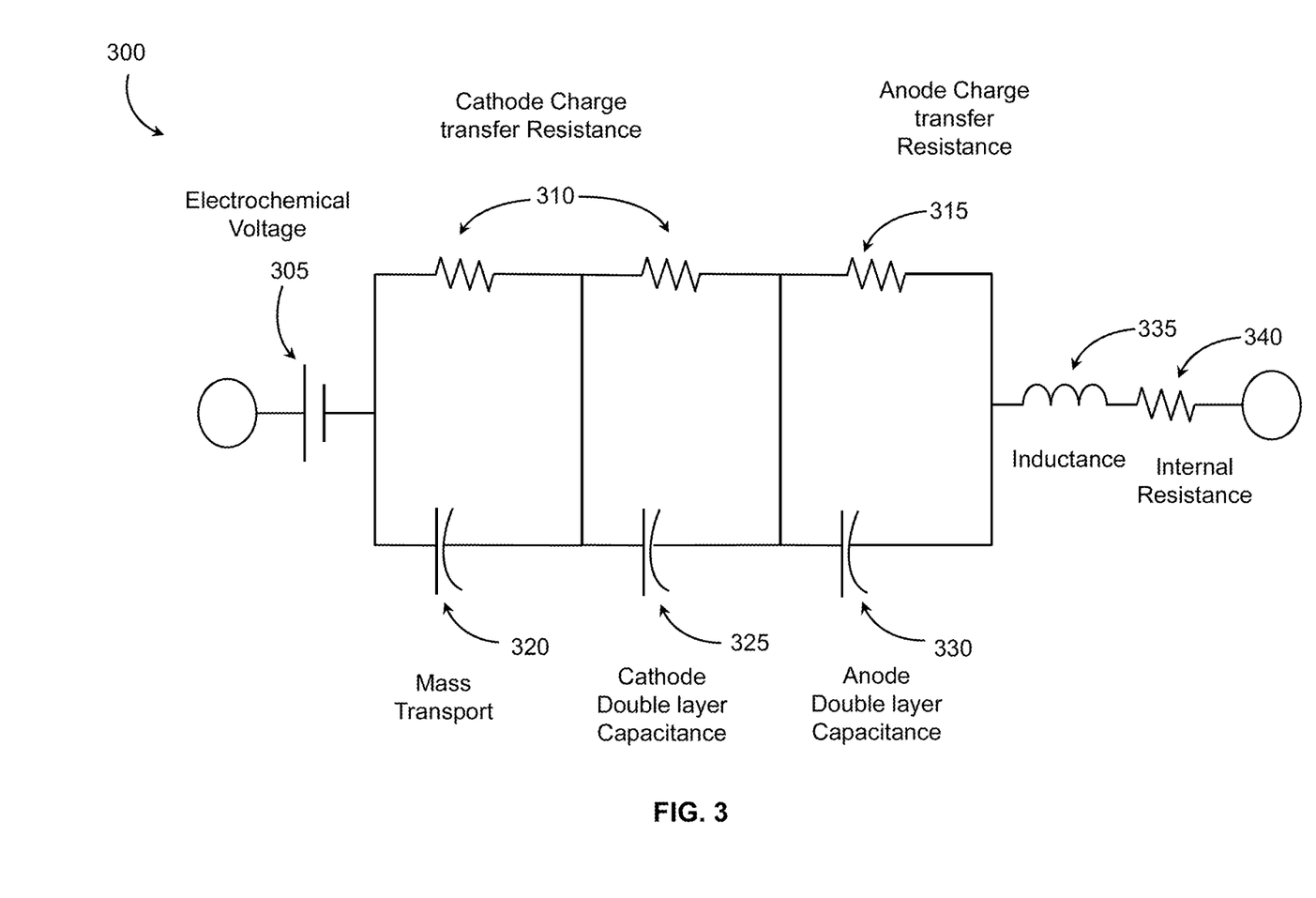
FIG. 3 shows a schematic representation of a Randles Model Equivalent Circuit, which illustrates how a "current interrupt method" may enable determination of impedance of an EV battery system, according to an exemplary embodiment.

As previously described, battery internal resistance, $R_{int}$, is a measurement corresponding the real component of the complex impedance of a contained cell(s). FIG. 3 shows a schematic representation of a simple electrical model 300 of complex impedance, which is generally known as the Randles circuit model. In the Randles model, each electrode redox reaction is modeled with a resistor (e.g., resistors 310 and 315) and a capacitor (e.g., capacitors 320, 325, and 330) to represent a charge transfer resistance and a double layer capacitance for the electrodes, respectively. Generally, the charge transfer resistance represents an activation energy required to drive an intended electrode reaction forward at a specific rate. Generally, the double layer capacitance is a measure of a slowness of the electrode reaction resulting from charges, which may build up on each side of the electrode at the predetermined specific rate.

In many cells, a supporting electrolyte (i.e., an ionic conductor) is a source of most internal resistance as electrodes and external interconnection resistances (e.g., contact resistance between a current collector and active materials, resistance within wiring and/or welds, etc.) are usually much smaller contributors in comparison. In addition, current flow generates heat, which may impact internal resistance 340 measurements and thus should be taken into consideration.

Broadly, elevated internal resistance 340 measurements can indicate that a cell is nearing failure since electrolyte resistance tends to increase as cells age. For example, it may be determined (e.g., by the diagnostic device 120) that a cell is nearing failure when it is determined a cell resistance increases with each consecutive cycle and wherein the increase is greater than an average increase for the first 200 cycles of the cell. Although resistance can increase for reasons beyond those relating to chemistry of the cell, measuring internal resistance 340 (e.g., by diagnostic device 120) can generally serve as sufficient indication of overall health of an electrochemical cell (e.g., battery 110), particularly when evaluated over time. Furthermore, internal resistance 340 measurements may also enable evaluating if a battery can deliver its stored energy effectively. In general, a battery with low internal resistance is better able to deliver high current on demand. High resistance causes the battery to heat up excessively and voltage output to drop under high demand. This is especially important for heavy loads such as power tools and electric powertrains. Accordingly, the Randles circuit model shown in FIG. 3 helps illustrate how the "current interrupt method" is implemented to measure internal resistance 340 of a cell (e.g., within battery 110), which corresponds to the real component of the complex impedance. In the model 300, the geometrical inductance 335 of the cell and the test instrumentation (e.g., electrochemical voltage) 305 interconnections are also shown FIG. 3.

Figure 4A:
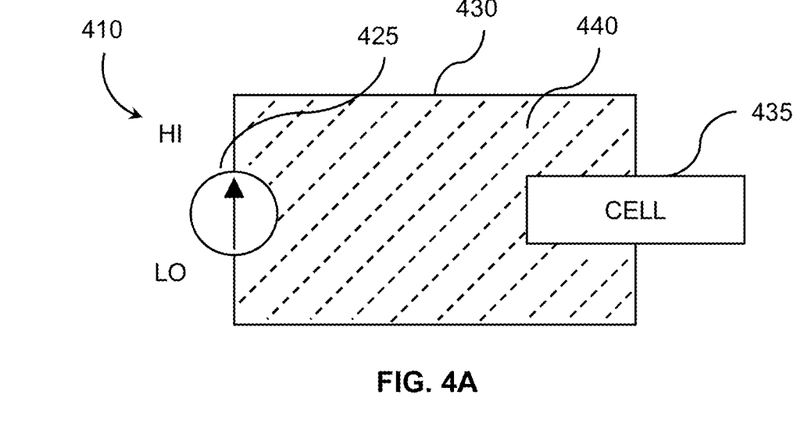
FIGS. 4A and 4B show schematic representations of internal resistance determination within a cell and illustrates how a "current interrupt method" may enable impedance determination of an EV battery system, according to an exemplary embodiment.
Figure 4B:
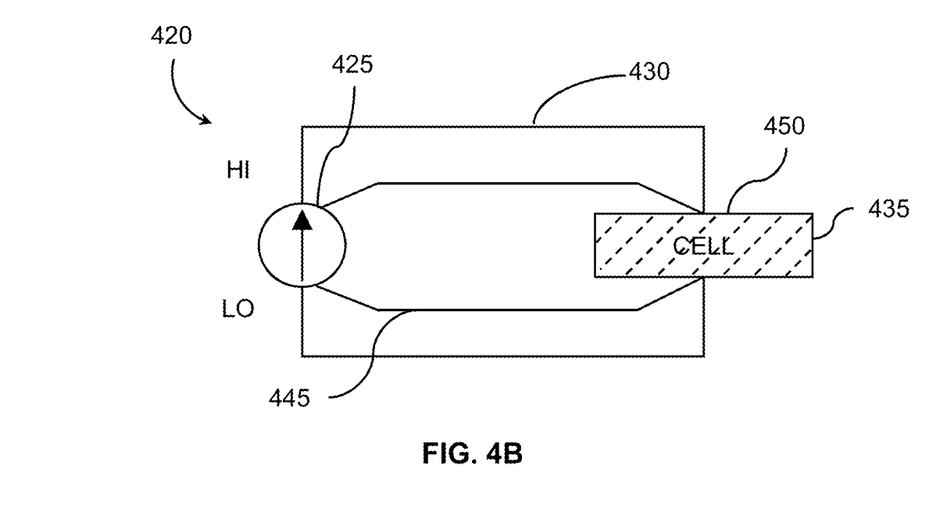

FIGS. 4A and 4B show schematic representations of two alternative methods for measurement setups (e.g., to be implemented by diagnostic device 120) for measuring internal resistance 340 (e.g., $R_{int}$) of a cell 435 (e.g., a cell within battery 110). FIG. 4A shows a 2-wire measurement setup 410 having a voltage source 425 to supply voltage (e.g., via power converter 150) within a 2-wire measurement loop having test leads 430 to enable internal resistance 340 measurement for a cell 435 (e.g., wherein cell 435 may be contained within battery 110). As shown in FIG. 4A, if this measurement is set up without remote sensing enabled, an inductance 440, as shown in the model 300, will be the total inductance of the measurement loop formed by test leads 430. However, with remote sensing enabled, the inductance 450 of the cell itself can be measured (as shown FIG. 4B), and an impedance between sensing leads 445 can be measured, complex or not. When an SMU is operably coupled to voltage source 425 in a remote sense (4-wire) configuration 420 as shown in FIG. 4B, external sensing by sensing leads 445 provides a feedback voltage that can be measured and compared to the programmed voltage level (e.g., provided by voltage source 425). In various implementations, the voltage source 425 may be adjusted until the feedback voltage detected by sensing leads 445 is approximately equal to the programmed voltage level. Remote sensing (e.g., via system 420) compensates for a voltage drop in the test leads 430, thereby ensuring the programmed voltage level is delivered to a working electrode in the cell 435.

Figure 5:
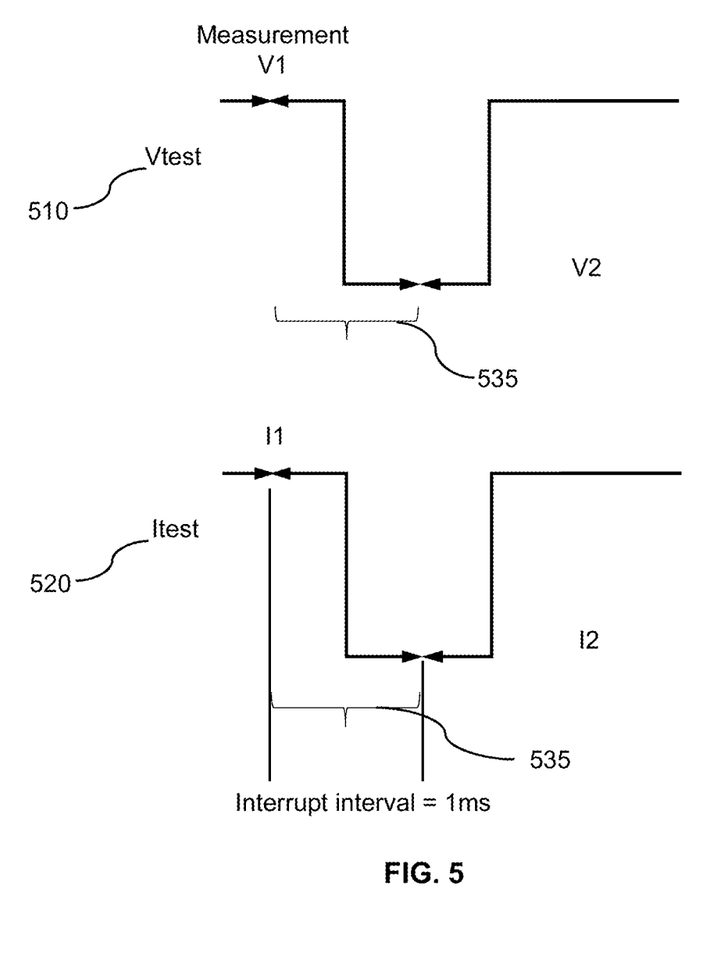
FIG. 5 shows a graphic representation of an example interruption interval during an impedance determination, according to an exemplary embodiment.

FIG. 5 shows voltage and current measurements $V_{test}$ 510 and $I_{test}$ 520, which illustrate a change in current and voltage within a cell (e.g., cell 435) during a "current interrupt method" that may be carried out by diagnostic device 120 to facilitate measurement of the internal resistance $R_{int}$ of cell 435 (wherein cell 435 may be included within battery 110). To measure $R_{int}$, (e.g., by the diagnostic device 120) using the "current interrupt method," an interruption or change in the cell 435 current (i.e., change from a first current $I_1$ to a second current $I_2$) needs to be measured within a precise span of time within an interrupt interval 535 so that the cell 435 has a reactance sum (i.e., opposition within the cell to a flow of current therein) of zero, which enables measurement of on the real component of the internal resistance. In general, there is only one interrupt delay that can satisfy the reactance sum requirement for any given cell 435 and measurement geometry (e.g., setup 410 and/or setup 420 as implemented by diagnostic device 120). In various embodiments, interrupt intervals can vary from 80 microseconds to several milliseconds depending on a size and/or configuration of the cell 435.

Figure 6:
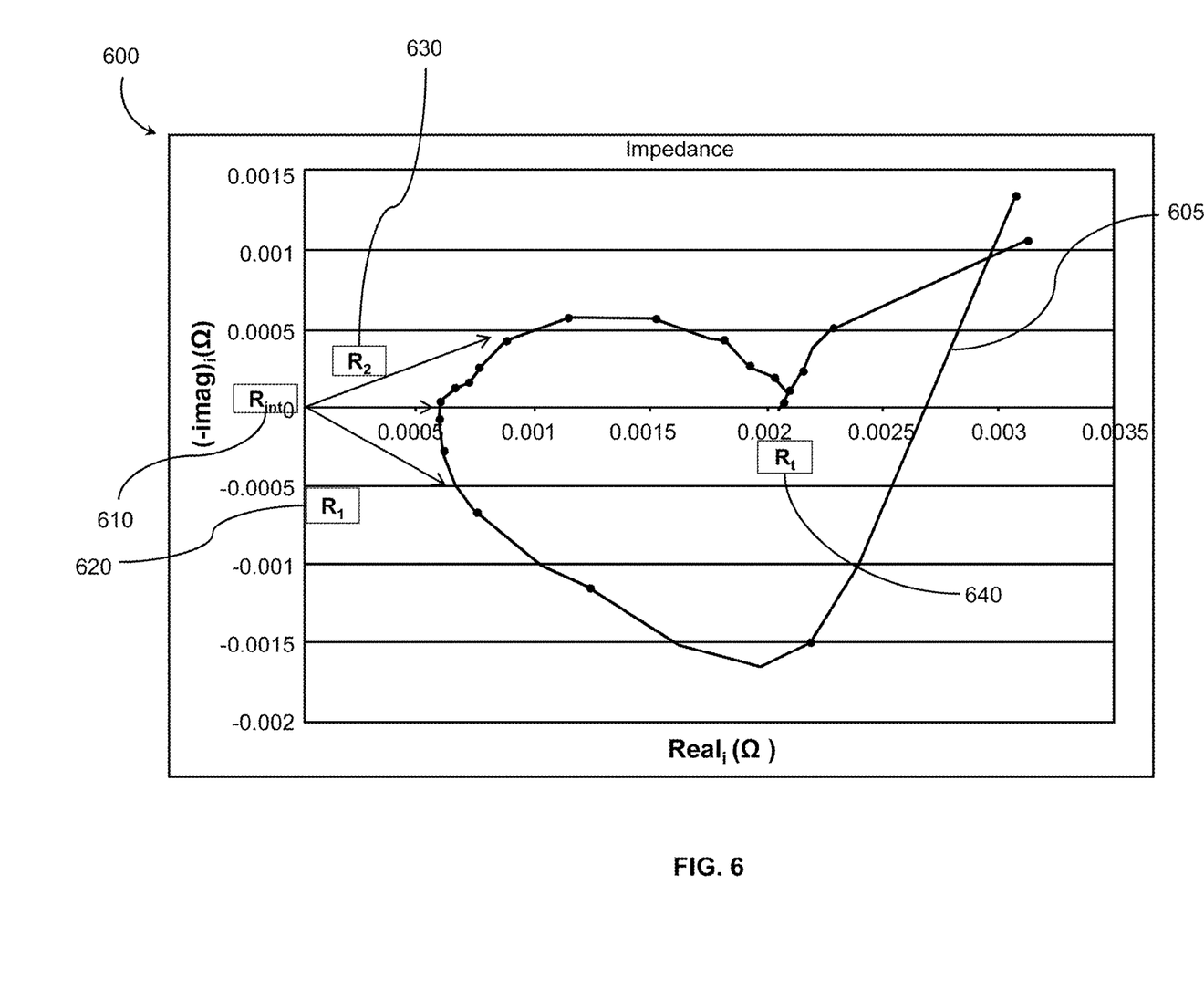
FIG. 6 shows an example complex impedance chart, which illustrates how a "current interrupt method" may enable determination of impedance of an EV battery system, according to an exemplary embodiment.

In various implementations, a calibration of the "current interrupt method" may be carried out by the diagnostic device 120 to enable obtaining accurate values for measured internal resistance. In various implementations, an EIS plot 600 may be generated to compare measured complex and real components of cell 435 impedance over a range of operating cell currents as shown in FIG. 6. As illustrated, the internal resistance 610 is characterized by a point on the curve 605 where the complex impedance, "$(-\text{imag}_i)$," crosses the real axis, "$\text{Real}_i$," or when reactive components sum to zero. Accordingly, the diagnostic device 120 may carry out one or more calibrations by implementing EIS (e.g., generating one or more plots resembling plot 600) during interrupt intervals (e.g., interrupt interval 535) determine internal resistance $R_{int}$ for each cell (e.g., cell 435) and/or module within a battery to be diagnosed (e.g., battery 110).

As discussed previously, FIG. 6 shows a complex impedance plot 600 obtained via the EIS method, according to an exemplary embodiment. As shown, the "current interrupt method" used to measure $R_{int}$ imparts a scalar measurement, representing the magnitude of an internal resistance $R_{int}$ impedance vector 610, which is shown superimposed on the complex impedance plot 600 in FIG. 6. In various embodiments, an appropriate current interrupt interval 535 can be found by varying the interrupt interval 535 to minimize magnitude of the $R_{int}$ vector magnitude 610. Accordingly, $R_1$ and $R_2$ vectors 620 and 630, respectively, which may be obtained through changing the interrupt interval 535, may consequently show larger magnitudes in comparison to the $R_{int}$ vector 610. $R_1$ and or $R_2$ may correspond to impedance contributions from electrochemical processes and/or diffusion within the battery. It can be noted that a point at which curve 605 crosses the horizontal axis (i.e., $\text{Real}_i$ axis) for a second time does not represent battery internal resistance $R_{int}$ but rather the crossing point may represent a sum of all resistances within a cell system, such as the resistances described in reference to model 300 and illustrated in FIG. 3. Instead, the second crossing point of curve 605 is referred to as the total resistance $R_t$ 640, which is shown in FIG. 6. Accordingly, the herein descried EIS method to calibrate the "current interrupt method" may be implemented by the diagnostic device 120 to enable consistent determination of accurate internal resistance measurements for cells/modules contained within second life EV batteries (e.g., battery 110).

In various embodiments, an SMU may be used measure impedance of each cell/module within a second life battery pack (e.g., battery 110) after the battery has been removed from its first life use (e.g., an EV). In various embodiments, the SMU may be a chip included within a printed circuit board that may be included within the diagnostic device 120. In general, SMUs may be well suited to obtain open circuit potential measurements for electrochemical cells since such cells may require instruments with high input impedance, which the SMU can provide. In various implementations, when paired with electrochemistry test scripts, SMUs may operate as a galvanosat or potentiostat, and can thus measure the internal resistance $R_{int}$ of batteries (e.g., battery 110), fuel cells, or any electrochemical cell while providing a polarization current.

In various embodiments, a method for predicting remaining lifetime of used and unopened electric vehicle battery may comprise: determining, by a diagnostic device, performance data associated with a battery, wherein the battery is operably coupled to the diagnostic device, and wherein the performance data includes one or more performance parameters; determining, by the diagnostic device, a state of health of the battery, wherein the state of health is based on the performance data; comparing, by the diagnostic device, the determined performance data to stored data, wherein the stored data is associated with one or more deployed second use batteries; predicting, by the diagnostic device, a remaining expected life of the battery based on the comparison of the determined performance data to the stored data; and determining, by the diagnostic device, a set of preferred operation parameters for the battery, wherein the determination is based on at least one of the state of health of the battery and the predicted remaining expected life of the battery. In various embodiments, the method may further include providing, by the diagnostic device, a recommendation related to a second life use application for the battery based on the determined preferred operation parameters.

In various embodiments, the diagnostic device is operably coupled to the battery via a control unit associated with the battery. In various embodiments, the battery includes one or more electrochemical cells.

In various embodiments, determining the state of health of the battery may include: reading a voltage associated with battery; determining a state of charge of the battery; discharging the battery to a first predetermined capacity set point; charging the battery to a second predetermined capacity set point; and performing a current interrupt operation to determine an impedance associated with the battery, wherein at least one of the first predetermined capacity set point and the second capacity set point are based on the state of charge of the battery. In various embodiments, the impedance is based on a Randles circuit equivalent model.

In various embodiments, the performance data includes at least one of an internal resistance, a voltage, an efficiency, a maximum discharge capacity, and a maximum charge capacity.

In various embodiments, a method for predicting a remaining lifetime of a used and unopened electric vehicle battery may include performing, by a diagnostic device coupled to battery, a calibration operation; determining, by the diagnostic device, a state of health of the battery, wherein the state of health is based on the minimum internal resistance; comparing, by the diagnostic device, the determined minimum internal resistance to stored data, wherein the stored data corresponds to one or more deployed second life batteries; predicting, by the diagnostic device, a remaining expected life of the battery based on the comparison of the determined minimum internal resistance to the stored data; and determining, by the diagnostic device, a set of preferred operation parameters for the battery, wherein the determination is based on at least one of the state of health of the battery and the predicted remaining expected life of the battery.

In various embodiments, the calibration operation includes: varying a current interruption interval provided to the battery during a predetermined interruption time period; measuring an internal resistance associated with the battery during the interruption time period; and setting the current interruption interval based on a determined minimum internal resistance corresponding to the current interruption interval.

In various embodiments, the method may further include repeating, by the diagnostic device, the calibration operation when the battery is discharged to a predetermined state of discharge.

In various embodiments, determining the state of health of the battery may include: reading a voltage associated with battery; determining a state of charge of the battery; discharging the battery to a first predetermined capacity set point; charging the battery to a second predetermined capacity set point; and performing a current interrupt operation to determine an impedance associated with the battery, wherein at least one of the first predetermined capacity set point and the second capacity set point are based on the state of charge of the battery.

In various embodiments, the current interrupt operation is based on the set current interruption interval. In various embodiments, the internal impedance is based on a Randles circuit equivalent model.

In various embodiments, a device for predicting a remaining lifetime of a used and unopened electric vehicle battery may include a non-transitory computer-readable medium storing a computer program therein, which, when executed, causes the controller to perform the following operations: determining performance data associated with a battery, wherein the performance data includes one or more performance parameters; determining a state of health of the battery based on the performance data; comparing the performance data to stored data, wherein the stored data is associated with one or more deployed second use batteries; predicting a remaining expected life of the battery based on the comparison of the determined performance data to the stored data; and determining, by the diagnostic device, a set of preferred operation parameters for the battery, wherein the determination is based on at least one of the state of health of the battery and the predicted remaining expected life of the battery.

In various embodiments, the operations may further include: determining a set of preferred operation parameters for the battery, wherein the determination is based on at least one of the state of health of the battery and the predicted remaining expected life of the battery; and providing a recommendation related to a second life use application for the battery based on the determined preferred operation parameters.

In various embodiments, the diagnostic device is operably coupled to the battery via a control unit associated with the battery. In various embodiments, determining the state of health of the battery includes: reading a voltage associated with battery; determining a state of charge of the battery; discharging the battery to a first predetermined capacity set point; charging the battery to a second predetermined capacity set point; and implementing a current interrupt method to determine an impedance associated with the battery; wherein at least one of the first predetermined capacity set point and the second capacity set point are based on the state of charge of the battery.

In various embodiments, the operations further include: varying a current interruption interval provided to the battery during a predetermined interruption time period; measuring an internal resistance associated with the battery during the interruption time period; and setting the current interruption interval based on a determined minimum internal resistance corresponding to the current interruption interval.

In various embodiments, the controller is operably coupled to a power converter, and wherein the controller is configured to cause the power converter to charge or discharge the battery based on a voltage associated with the battery. In various embodiments, the controller causes the power converter to discharge the battery if the voltage meets a predetermined voltage threshold.

In various embodiments, the operations further include determining historical information associated with the battery, wherein the historical information includes one or more operational parameters corresponding to a first use application of the battery.

Notwithstanding the embodiments described above in FIGS. 1-6, various modifications and inclusions to those embodiments are contemplated and considered within the scope of the present disclosure.

It is also to be understood that the construction and arrangement of the elements of the systems and methods as shown in the representative embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter disclosed.

Accordingly, all such modifications are intended to be included within the scope of the present disclosure. Any means-plus-function clause is intended to cover the structures described herein as performing the recited function and not only structural equivalents but also equivalent structures. Other substitutions, modifications, changes, and omissions may be made in the design, operating conditions, and arrangement of the preferred and other illustrative embodiments without departing from scope of the present disclosure or from the scope of the appended claims.

Furthermore, functions and procedures described above may be performed by specialized equipment designed to perform the particular functions and procedures. The functions may also be performed by general-use equipment that executes commands related to the functions and procedures, or each function and procedure may be performed by a different piece of equipment with one piece of equipment serving as control or with a separate control device.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to disclosures containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Similarly, unless otherwise specified, the phrase "based on" should not be construed in a limiting manner and thus should be understood as "based at least in part on." Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances, where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent Moreover, although the figures show a specific order of method operations, the order of the operations may differ from what is depicted. Also, two or more operations may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection operations, processing operations, comparison operations, and decision operations.

What is claimed is:

1. A method for predicting remaining lifetime of used and unopened electric vehicle battery, the method comprising:
    determining, by a diagnostic device, performance data associated with a battery, wherein the battery is operably coupled to the diagnostic device, and wherein the performance data comprises one or more performance parameters;
    determining, by the diagnostic device, a state of health of the battery, wherein the state of health is based on the performance data, wherein determining the state of health of the battery comprises a calibration operation, the calibration operation comprising:
    performing a current interrupt operation over a predetermined current interrupt interval to determine an impedance associated with the battery, and wherein the current interrupt interval is determined by minimizing a magnitude of an internal resistance vector associated with the battery during the current interrupt interval, the internal resistance vector corresponding to a scalar resistance superimposed on a complex impedance plot associated with the battery;
    comparing, by the diagnostic device, the determined performance data to stored data, wherein the stored data is associated with one or more deployed second use batteries;
    predicting, by the diagnostic device, a remaining expected life of the battery based on the comparison of the determined performance data to the stored data; and
    determining, by the diagnostic device, a set of preferred operation parameters for the battery, wherein the determination is based on at least one of the state of health of the battery and the predicted remaining expected life of the battery.

2. The method of claim 1, further comprising:
    providing, by the diagnostic device, a recommendation related to a second life use application for the battery based on the determined preferred operation parameters.

3. The method of claim 1, wherein the diagnostic device is operably coupled to the battery via a control unit associated with the battery.

4. The method of claim 1, wherein the battery comprises one or more electrochemical cells.

5. The method of claim 1, wherein determining the state of health of the battery comprises:
    reading a voltage associated with battery;
    determining a state of charge of the battery;
    discharging the battery to a first predetermined capacity set point; and
    charging the battery to a second predetermined capacity set point;
    wherein at least one of the first predetermined capacity set point and the second capacity set point are based on the state of charge of the battery.

6. The method of claim 1, wherein the performance data includes at least one of an internal resistance, a voltage, an efficiency, a discharge capacity, and a charge capacity.

7. The method of claim 1, further comprising:
    repeating, by the diagnostic device, the calibration operation when the battery is discharged to a predetermined state of discharge.

8. The method of claim 1, wherein the battery is a lithium-ion battery.

9. The method of claim 5, wherein the impedance is based on a Randles circuit equivalent model.

10. The method of claim 5, wherein reading voltage comprises performing three voltage measurements, a first voltage measurement being at a first state of discharge, the second voltage measurement being at a second state of discharge, and a third voltage measurement being at a third state of discharge.

11. The method of claim 10, wherein the first state of discharge is 100%, the second state of discharge is 50%, and the third state of discharge is 10%.

12. A device for predicting a remaining lifetime of a used and unopened electric vehicle battery, the device comprising a non-transitory computer-readable medium storing a computer program therein, which, when executed, causes the controller to perform operations comprising:
    determining performance data associated with a battery, wherein the performance data comprises one or more performance parameters;
    determining a state of health of the battery based on the performance data, wherein determining the state of health of the battery comprises a calibration operation, the calibration operation comprising:
    performing a current interrupt operation over a predetermined current interrupt interval to determine an impedance associated with the battery, and wherein the current interrupt interval is determined by minimizing a magnitude of an internal resistance vector associated with the battery during the current interrupt interval, the internal resistance vector corresponding to a scalar resistance superimposed on a complex impedance plot associated with the battery;
    comparing the performance data to stored data, wherein the stored data is associated with one or more deployed second use batteries;
    predicting a remaining expected life of the battery based on the comparison of the determined performance data to the stored data; and
    determining, by the diagnostic device, a set of preferred operation parameters for the battery, wherein the determination is based on at least one of the state of health of the battery and the predicted remaining expected life of the battery.

13. The device of claim 12, wherein the operations further comprise:
    determining a set of preferred operation parameters for the battery, wherein the determination is based on at least one of the state of health of the battery and the predicted remaining expected life of the battery; and
    providing a recommendation related to a second life use application for the battery based on the determined preferred operation parameters.

14. The device of claim 12, wherein the diagnostic device is operably coupled to the battery via a control unit associated with the battery.

15. The method of claim 12, wherein determining the state of health of the battery comprises:
- reading a voltage associated with battery;
- determining a state of charge of the battery;
- discharging the battery to a first predetermined capacity set point; and
- charging the battery to a second predetermined capacity set point;
- wherein at least one of the first predetermined capacity set point and the second capacity set point are based on the state of charge of the battery.

16. The device of claim 12, wherein the controller is operably coupled to a power converter, and wherein the controller is configured to cause the power converter to charge or discharge the battery based on a voltage associated with the battery.

17. The device of claim 12, wherein the operations further comprise:
- determining historical information associated with the battery, wherein the historical information comprises one or more operational parameters corresponding to a first use application of the battery.

18. The method of claim 15, wherein the operations further comprise:
- varying a current interruption interval provided to the battery during a predetermined interruption time period;
- measuring an internal resistance associated with the battery during the interruption time period; and
- setting the current interruption interval based on a determined minimum internal resistance corresponding to the current interruption interval.

19. The device of claim 16, wherein the controller causes the power converter to discharge the battery if the voltage meets a predetermined voltage threshold.

20. The method of claim 15, wherein discharging the battery to a first predetermined capacity set point comprises reducing a voltage of the battery at a rate of 1 mV/sec.

* * * * *